United States Patent
Pagaila et al.

(10) Patent No.: US 8,502,352 B2
(45) Date of Patent: Aug. 6, 2013

(54) SEMICONDUCTOR DEVICE WITH CONDUCTIVE VIAS BETWEEN SAW STREETS

(75) Inventors: Reza A. Pagaila, Singapore (SG); Linda Pei Ee Chua, Singapore (SG); Byung Tai Do, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 1 day.

(21) Appl. No.: 13/228,248

(22) Filed: Sep. 8, 2011

(65) Prior Publication Data

US 2012/0018900 A1 Jan. 26, 2012

Related U.S. Application Data

(62) Division of application No. 12/121,682, filed on May 15, 2008, now Pat. No. 8,030,136.

(51) Int. Cl.
*H01L 23/544* (2006.01)

(52) U.S. Cl.
USPC ............... 257/620; 257/E21.516; 438/125; 438/461; 438/618

(58) Field of Classification Search
USPC .......................... 257/E21.516, 620
See application file for complete search history.

(56) References Cited

U.S. PATENT DOCUMENTS

| | | | |
|---|---|---|---|
| 6,908,856 B2 | 6/2005 | Beyne et al. | |
| 7,452,739 B2 | 11/2008 | Chu et al. | |
| 2004/0178495 A1 * | 9/2004 | Yean et al. | 257/723 |
| 2005/0176235 A1 | 8/2005 | Noma et al. | |
| 2006/0008974 A1 | 1/2006 | Imai | |
| 2008/0283971 A1 | 11/2008 | Huang et al. | |

* cited by examiner

*Primary Examiner* — Ajay K Arora
(74) *Attorney, Agent, or Firm* — Robert D. Atkins; Patent Law Group: Atkins & Associates, P.C.

(57) ABSTRACT

A semiconductor device is made by disposing a plurality of semiconductor die on a carrier and creating a gap between each of the semiconductor die. A first insulating material is deposited in the gap. A portion of the first insulating material is removed. A conductive layer is formed over the semiconductor die. A conductive lining is conformally formed on the remaining portion of the first insulating material to form conductive via within the gap. The conductive vias can be tapered or vertical. The conductive via is electrically connected to a contact pad on the semiconductor die. A second insulating material is deposited in the gap over the conductive lining. A portion of the conductive via may extend outside the first and second insulating materials. The semiconductor die are singulated through the gap. The semiconductor die can be stacked and interconnected through the conductive vias.

19 Claims, 9 Drawing Sheets

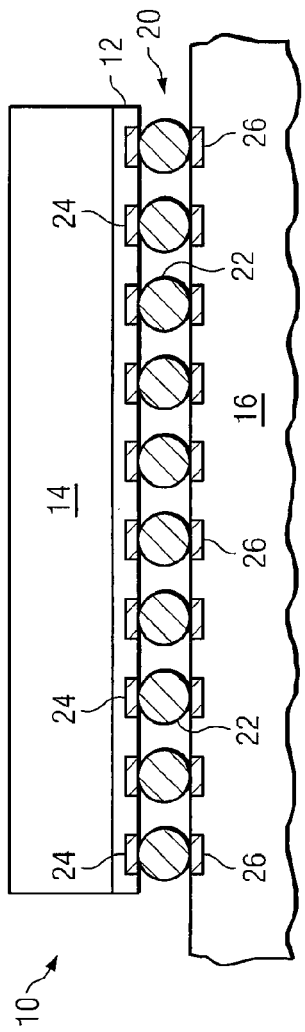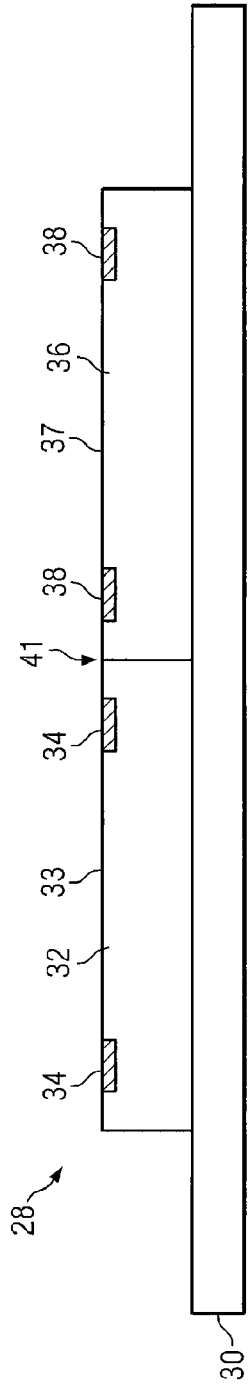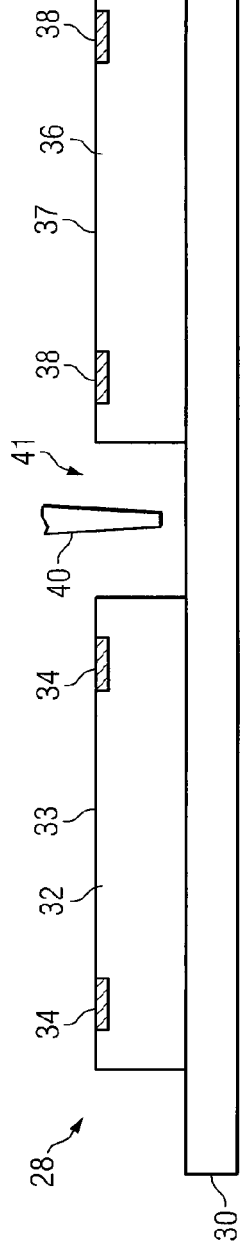

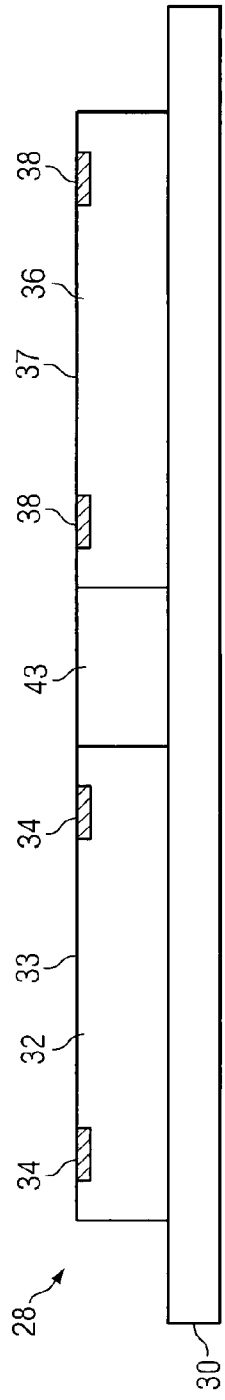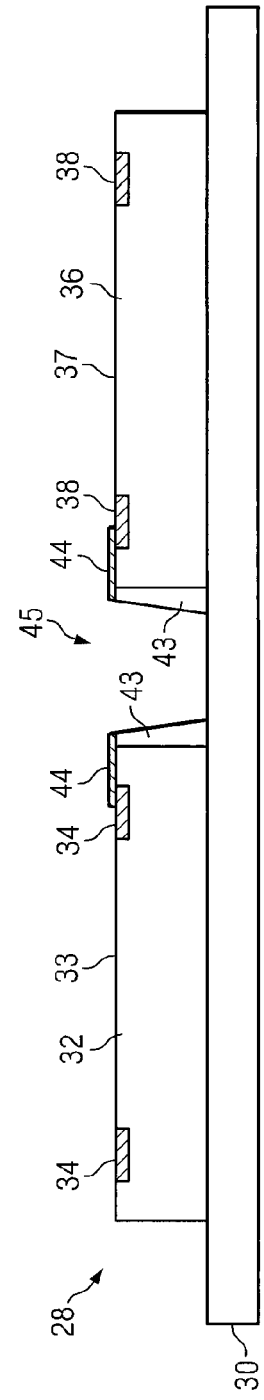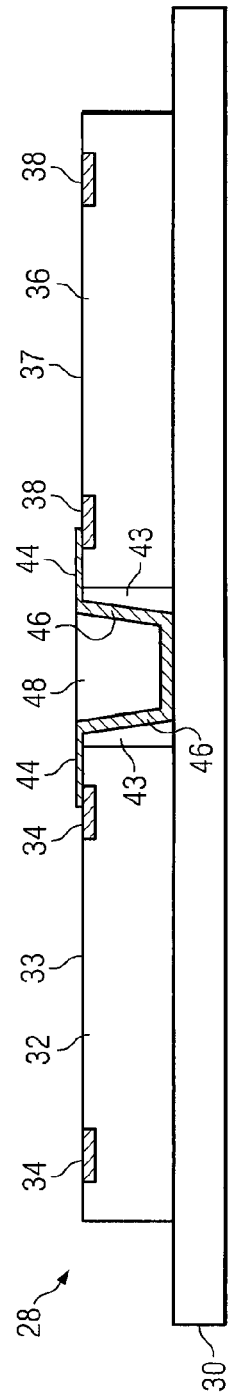

SEMICONDUCTOR DEVICE WITH CONDUCTIVE VIAS BETWEEN SAW STREETS

CLAIM OF DOMESTIC PRIORITY

The present application is a division of U.S. patent application Ser. No. 12/121,682, now U.S. Pat. No. 8,030,136, filed May 15, 2008, and claims priority to the foregoing parent application pursuant to 35 U.S.C. §121.

FIELD OF THE INVENTION

The present invention relates in general to semiconductor devices and, more particularly, to a semiconductor device having conductive vias conformally formed between insulating layers in the saw street.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to vertically stack semiconductor die for greater device integration and minimize interconnect routing. The electrical interconnection between stacked semiconductor die has been done by using through hole vias which traverse from a front side to the backside of the die. The through hole vias are formed by drilling through the active area of the die or through saw streets on the wafer prior to any dicing operation. The process of drilling through hole vias in the active area of the die or in saw streets on the wafer can cause damage to the wafer and/or die.

The demand for more device functionality and higher integration requires more input and output (I/O) capability. As the number of interconnect pads increases, the number of vias in the saw street must correspondingly increase. If the via size remains the same, adding more vias necessarily increases the total size of the package which is undesirable when miniaturization is a design goal. If the pitch between vias is reduced, i.e., adjacent vias are placed closer together, the insulating material between the vias becomes thin which can increase parasitic capacitance.

Another problem arises when prior art vias completely fill the hole with conductive material. The via filling process can take considerable time, reducing manufacturing throughput. Chemical mechanical polishing (CMP) may be necessary to planarize after plating the conductive material. Moreover, the full via contributes to high thermal stress.

SUMMARY OF THE INVENTION

A need exists to interconnect stacked semiconductor die with a conductive via requiring minimal pitch while avoiding the design limitations noted above.

Accordingly, in one embodiment, the present invention is a semiconductor device comprising a semiconductor die and first insulating material deposited around a peripheral region of the semiconductor die. A first conductive layer has vertical and lateral components formed in the peripheral region with the vertical component disposed over the first insulating material. A second insulating material is deposited in the peripheral region over the first conductive layer to form a conductive via disposed between the first and second insulating materials. A second conductive layer is formed over the semiconductor die and electrically connected between a contact pad on the semiconductor die and the first conductive layer.

In another embodiment, the present invention is a semiconductor device comprising a semiconductor die and first insulating material deposited around a peripheral region of the semiconductor die. A conductive layer is formed in the peripheral region over the first insulating material. A second insulating material is deposited in the peripheral region over the conductive layer to form a conductive via disposed between the first and second insulating materials.

In another embodiment, the present invention is a semiconductor device comprising a semiconductor die and first insulating material deposited around the semiconductor die. A first conductive layer is formed over the first insulating material. A second insulating material is deposited over the first conductive layer. A second conductive layer is formed over the semiconductor die and electrically connected between a contact pad on the semiconductor die and the first conductive layer.

In another embodiment, the present invention is a semiconductor device comprising a semiconductor die and first insulating material deposited around the semiconductor die. A conductive layer is formed over the first insulating material. A second insulating material is deposited over the conductive layer.

BRIEF DESCRIPTION OF THE DRAWINGS

FIG. 1 is a flip chip semiconductor device with solder bumps providing electrical interconnect between an active area of the die and a chip carrier substrate;

FIGS. 2a-2g illustrate a process of forming conformal conductive vias in the saw street around a periphery of the die;

DETAILED DESCRIPTION OF THE DRAWINGS

Figure 2F:
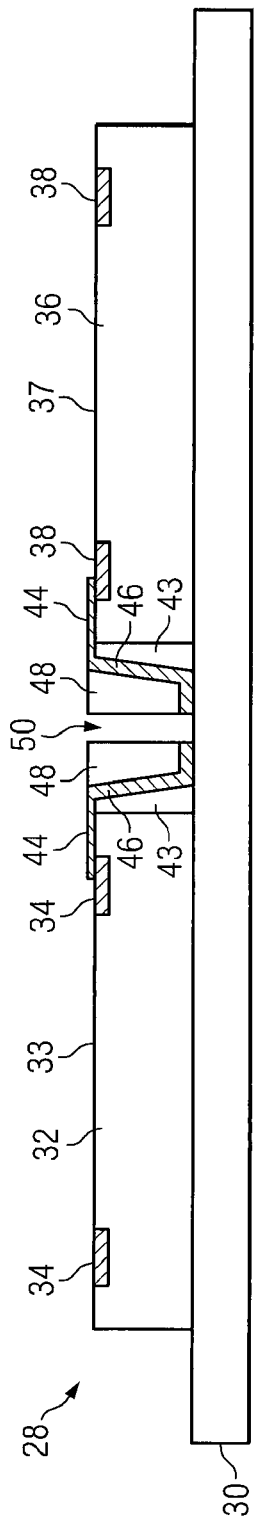

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. Analog circuits may be created by the combination of one or more passive devices formed within active area 12. For example, an analog circuit may include one or more inductors, capacitors, and resistors formed within active area 12. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

FIGS. 2a-2g illustrate a process of forming conformal conductive vias on a periphery of a semiconductor die in a wafer level chip scale package (WLCSP). To start the process, a plurality of semiconductor die is formed on semiconductor wafer 28 using conventional integrated circuit processes, as described above. The semiconductor wafer is mounted to expansion table 30 with ultraviolet (UV) tape, as shown in FIG. 2a. The backside of semiconductor die 32 is affixed to expansion table 30 with its active surface 33 and contact pads 34 oriented face up. Likewise, the backside of semiconductor die 36 is mounted to expansion table 30 with its active surface 37 and contact pads 38 oriented face up. Contact pads 34 and 38 electrically connect to active and passive devices and signal traces in active areas 33 and 37 of semiconductor die 32 and 36, respectively.

In FIG. 2b, a saw blade or laser tool 40 cuts through saw street 41 of semiconductor die 32 and 36 in a dicing operation. Expansion table 30 moves in the two-dimension lateral directions, as shown by arrows 42, to expand the width of saw street 41, i.e., form a gap to create a greater physical separation between the die. Expansion table 30 moves substantially the same distance in the x-axis and y-axis to provide equal separation around a periphery of each die. The post-expansion width of saw street or gap 41 ranges from 5 microns (μm) to 200 μm. The expanded dimension depends on the design embodiment, i.e. half via, full via, single row via, or double/multiple row via. The expanded saw street or gap 41 define a peripheral region around the semiconductor die.

In an alternate embodiment, semiconductor wafer 28 is diced to separate the semiconductor die. The individual semiconductor die are then transferred and affixed to a temporary chip carrier with an adhesive layer. The semiconductor die are placed on the chip carrier so as to have a predetermined separation gap. The separation gap has sufficient width to form conductive vias within the gap, as described below.

In FIG. 2c, an organic material 43 is deposited in gap 41 using spin coating, needle dispensing, or other suitable application process. Organic material 43 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in gap 41. The non-conductive materials can also be deposited using a transfer molding or injection molding process.

After deposition of organic material 43, the semiconductor die can be removed from the chip carrier and then mounted onto a second carrier.

A portion of organic material 43 is removed by laser drilling or etching to create via 45 extending down to expansion table 30, as shown in FIG. 2d. The walls of the remaining portion of organic material 43, which define via 45, can be vertical or tapered.

An electrically conductive material 44 is patterned and deposited on the active surface of semiconductor die 32 and 36 using an evaporation, electrolytic plating, electroless plating, screen printing, or other suitable metal deposition process. The conductive layer 44 can be made with aluminum (Al), copper (Cu), tin (Sn), nickel (Ni), gold (Au), or silver (Ag). The conductive layer 44 extends from contact pads 34 and 38 to via 45.

In FIG. 2e, an electrically conductive via lining 46 is conformally applied along the walls of the remaining portion of organic material 43 in via 45. Conductive via lining 46 electrically connects to conductive layer 44. Conductive via lining 46 includes an optional seed layer. The seed layer and conductive via lining 46 are patterned and deposited using a conformal electrolytic plating, electroless plating, or other suitable metal deposition process. The seed layer can be made with Cu, Ni, nickel vanadium (NiV), Cu, Au, or Al. The conductive via lining 46 can be made with Al, Cu, Sn, Ni, Au, or Ag. The conformal application of the conductive lining 46 along the walls of the remaining portion of organic material 43 defines the conductive via within the gap. The conductive via lining 46 is relatively thin, having a thickness of typically about 2 µm to 50 µm.

An organic material 48 is deposited over conductive via lining 46 using spin coating, needle dispensing, or other suitable application process to completely fill the remaining area of via 45 up to the top of the semiconductor die. Organic material 48 can be BCB, PI, or acrylic resin. Alternatively, other non-conductive materials such as a polymer molding compound, liquid epoxy molding, compression molding, soft laminating film, or other material having dielectric or electrical insulating properties can be laid over conductive via lining 46.

Semiconductor die 32 and 36 are singulated in FIG. 2f through a center portion of gap 41, i.e., through a center portion of via 45 to bisect conductive via lining 46 and create a conductive half via. The saw street or gap region is cut by a cutting tool such as a saw blade or laser. The cutting tool completely severs the gap region to separate the die. The semiconductor die are removed from expansion table 30. Each semiconductor die has a similar final configuration as described in FIG. 2f.

Figure 2G:
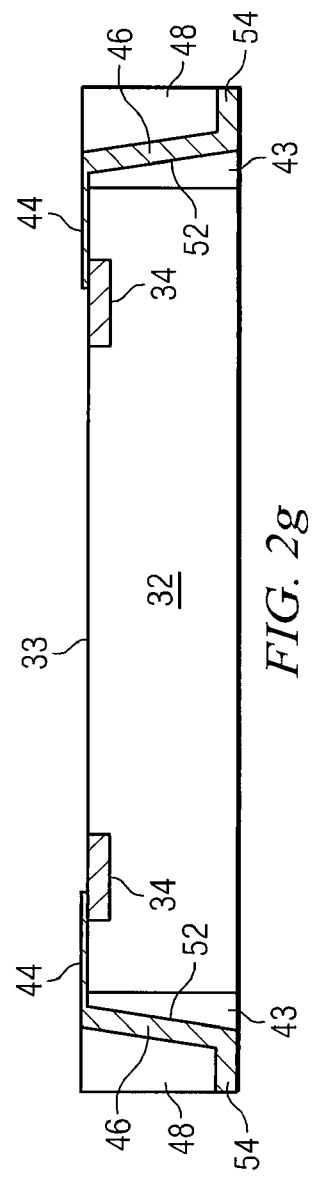

FIG. 2g shows semiconductor die 32 with conformal conductive half vias 46, surrounded by organic materials 43 and 48. Conductive half via 46 includes sidewall 52 and horizontal portion 54. The conformal conductive vias 46 are electrically connected to contact pads 34 by way of conductive layer 44. The conformal conductive vias 46 provide for efficient and compact electrical interconnect by direct via metal bonding when stacking semiconductor die within a semiconductor package. The electrical interconnect can be made to sidewall 52 of conductive vias 46 or to horizontal portion 54, as discussed below. The semiconductor die also supports other interconnect structures including micro bumps, solder balls, anisotropic conductive film (ACF), conductive adhesives, and solder paste within the semiconductor package.

The formation of conformal conductive half vias 46 uses a fast and simple process, as compared to the prior art. The conformal conductive via lining is a relatively thin layer formed on the sidewalls of the via. The thin conformal conductive half via structure allows the vias to be closely arranged for higher density placement and reduced package size. As noted in the background, a prior art process that completely fills the via would require a longer time to plate. In the present invention, a thin layer of conductive material, i.e., conductive lining 46, is conformally formed in the insulating layer in the gap, i.e., organic material 43. Consequently, there is no need for chemical mechanical polishing (CMP) after filling the via with conductive material. The conformal conductive via lining also exhibit lower parasitic capacitance between adjacent vias, uses less conductive materials, and has less thermal stress, which reduces failures and manufacturing cost and increases device performance. The placement of conformal conductive vias in the gap enables greater utilization of the active area of the semiconductor die.

Figure 3:
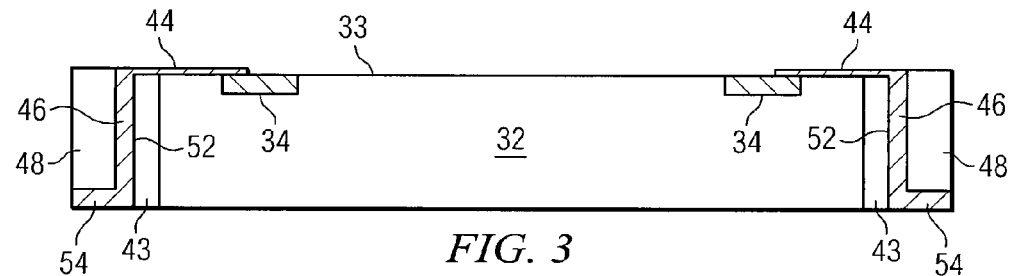
FIG. 3 illustrates vertical conformal conductive vias formed in the saw street around a periphery of the die.
Figure 4:
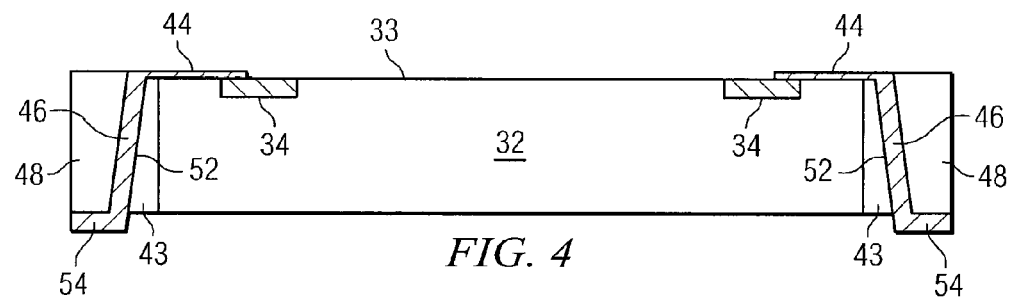
FIG. 4 illustrates a horizontal portion of the conductive vias extending beyond the insulating material.
Figure 5:
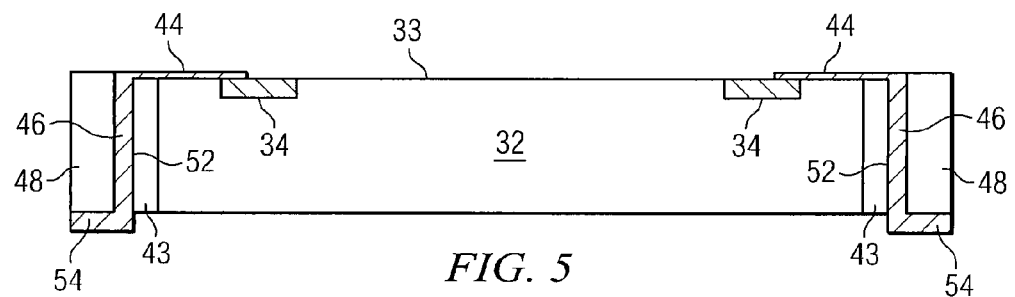
FIG. 5 illustrates vertical conductive vias with a horizontal portion extending beyond the insulating material.

An alternate embodiment of the conformal conductive half via is shown in FIG. 3 with a straight vertical structure. The vertical profile further reduces lateral gap spacing required for the interconnect structure. FIG. 4 shows horizontal portion 54 of conductive via 46 protruding from organic material 43 and 48. The protruding portion 54 can be made by applying photo-imageable tape to the backside of the wafer prior to wafer taping. Protruding portion 54 allows the semiconductor die to be stacked onto another device having a recessed insulating region. The interconnect structures reduce the total package height. FIG. 5 shows the protruding horizontal portion 54 on a straight vertical conductive half via 46.

Figure 6:
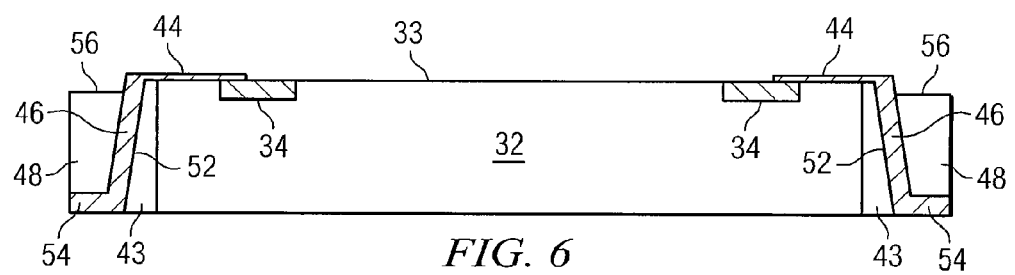
FIG. 6 illustrates conformal conductive vias with a recessed region in the insulating material.
Figure 7:
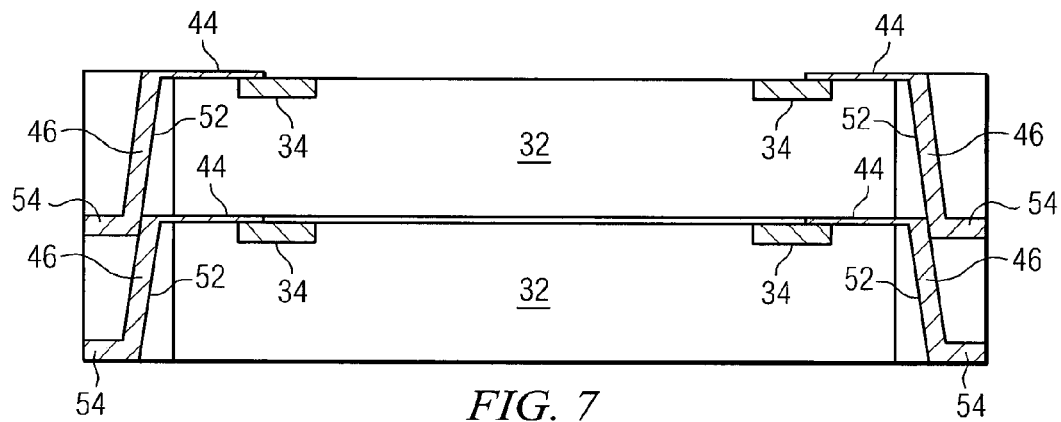
FIG. 7 illustrates two stacked semiconductor die interconnected with conformal conductive vias formed in the saw street.

In FIG. 6, organic material 48 has recessed region 56 for bonding to a device having a protruding portion 54 of conductive half via 54, as shown in FIGS. 4 and 5. The recessed region 56 can be formed by optimizing the non-conductive via filling parameters. Alternatively, recessed region 56 can be removed by CMP or etching. The semiconductor die with horizontal protruding portion 54 is stacked and bonded to the semiconductor die with recessed region 56 in FIG. 7. Notice that the electrical interconnect is made along tapered sidewalls 52 and horizontal portion 54.

Figure 8:
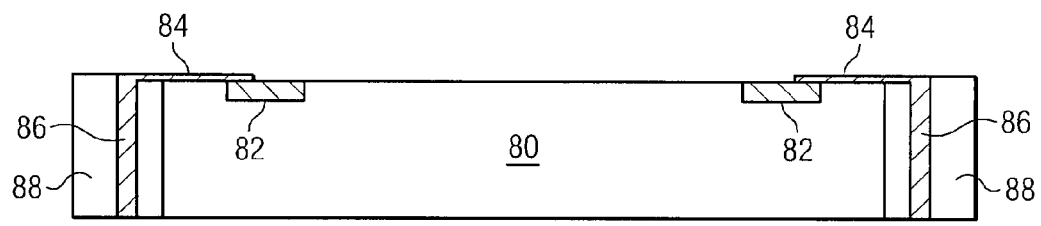
FIG. 8 illustrates a semiconductor die with vertical conformal conductive via formed in the saw street without a horizontal portion.
Figure 9:
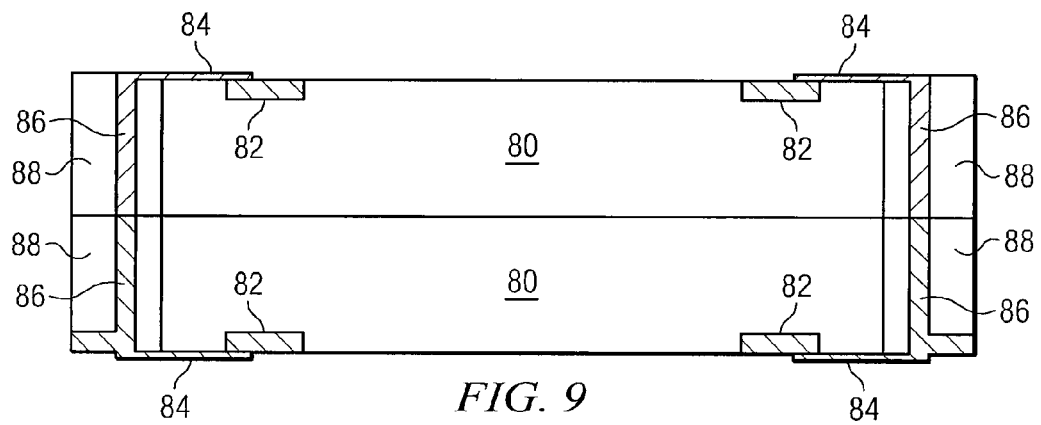
FIG. 9 illustrates two stacked semiconductor die interconnected with vertical conformal conductive vias formed in the saw street without a horizontal portion.

FIG. 8 shows semiconductor device 80 with contact pads 82. Conductive layer 84 electrically connects contact pads 82 to vertical conformal conductive half vias 86 which is electrically insulated by organic material 88. The vertical conductive half vias 86 is a half ring shape with organic material 88 occupying the central bottom portion, i.e., no horizontal portion like 54. FIG. 9 shows two semiconductor die like 80 stacked back-to-back and electrically bonded by vertical conductive half vias 86. The conformal vias in the back-to-back stacking scheme can be formed in one step for two stacked semiconductor devices.

Figure 10:
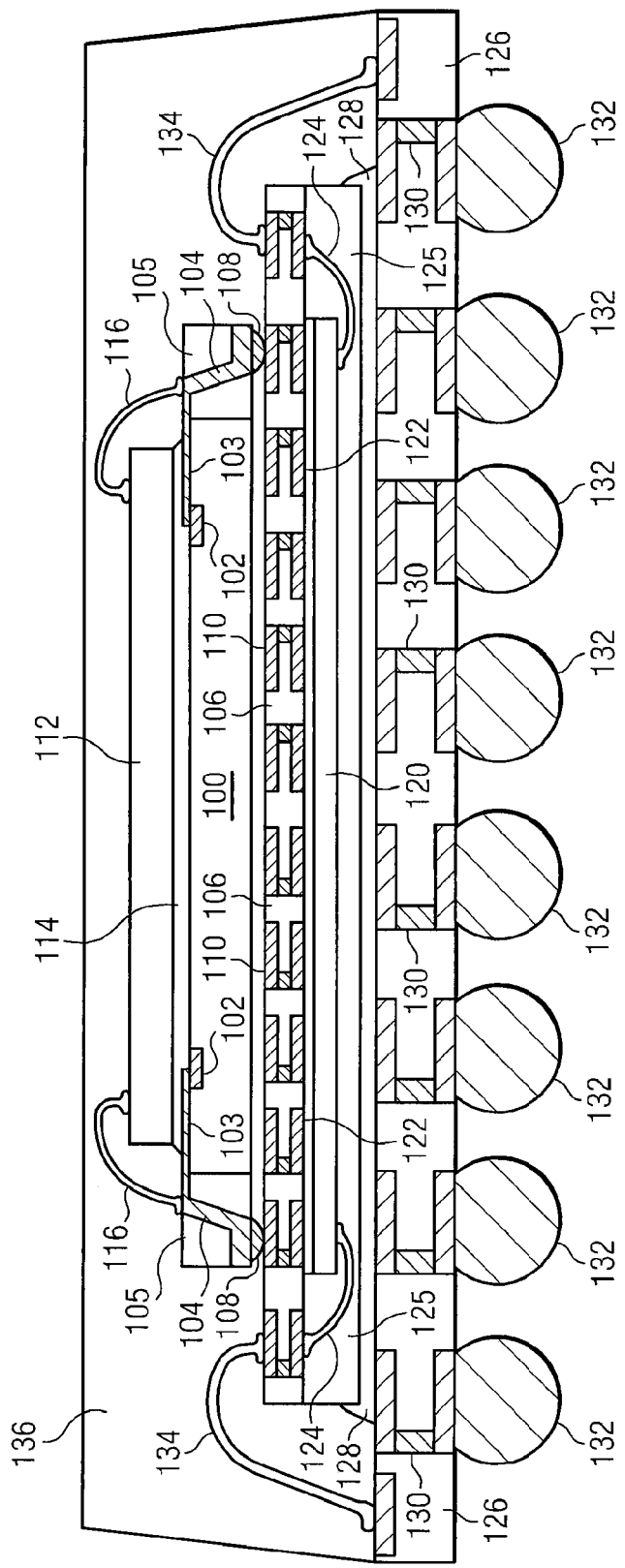
FIG. 10 illustrates a package-in-package with semiconductor die interconnected by conformal conductive vias formed in the saw street.

The aforedescribed semiconductor die with conformal conductive vias formed along the gap can be integrated into a package-in-package (PiP), as shown in FIG. 10. Semiconductor device 100 has contact pads 102. Contact pads 102 connect to conductive vias 104 by way of conductive layer 103. Conductive vias 104 are surrounded by insulating material 105 in the gap of semiconductor die 100 and electrically connect to contact pads 102. Conductive vias 104 further connect to interconnect structure 110 on substrate 106 by way of solder bumps 108. Semiconductor device 112 is mounted to semiconductor die 100 using adhesive layer 114. Semiconductor device 112 electrically connects to conductive vias 104 with bond wires 116. Semiconductor device 120 is mounted to a backside of substrate 106 using adhesive layer 122. Semiconductor device 120 electrically connects to interconnect structure 110 with bond wires 124. A molding compound or encapsulant 125 is deposited over semiconductor device 120 and bond wires 124. Molding compound 125 can be made with epoxy acrylate or other polymer material and applied by transfer molding, liquid encapsulant molding, or other molding process. Molding compound 125 is non-conductive and environmentally protects the semiconductor device from external elements and contaminants. In one embodiment, semiconductor devices 100, 112, and 120 are stacked memory devices.

The entire assembly 100-125 is mounted to substrate 126 with adhesive layer 128. An electrically conductive solder material is deposited over interconnect structure 130 on substrate 126 using an evaporation, electrolytic plating, electroless plating, ball drop, or screen printing process. The solder material can be any metal or electrically conductive material, e.g., Sn, lead (Pb), Ni, Au, Ag, Cu, bismuthinite (Bi), and alloys thereof. For example, the solder material can be eutectic Sn/Pb, high lead, or lead free. The solder material is reflowed by heating the solder material above its melting point to form solder bumps 132. In some applications, solder bumps 132 are reflowed a second time to improve electrical contact to interconnect sites 110. Bond wires 134 electrically connect interconnect structure 110 on substrate 106 with interconnect structure 130 on substrate 126. An encapsulant or molding compound 136 is formed over semiconductor devices 100 and 112, substrates 106 and 126, and bond wires 116 and 134. Conductive vias 104 performs an integrated part of the electrical interconnection between stacked semiconductor devices 100, 112, and 120 in the PiP.

Figure 11:
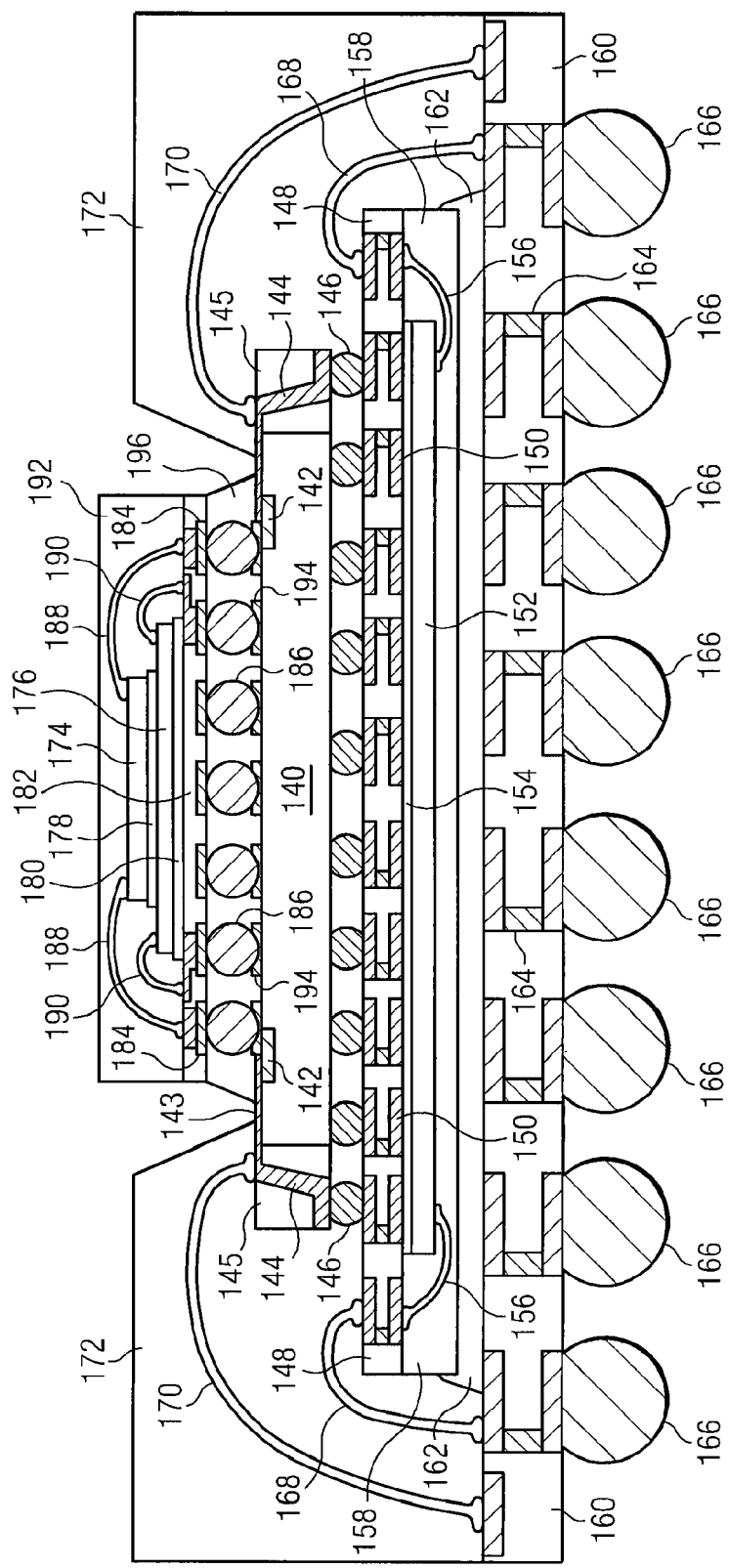
FIG. 11 illustrates a fan-in package-on-package with semiconductor die interconnected by conformal conductive vias formed in the saw street.

The aforedescribed semiconductor die with conformal conductive vias formed along the gap can be integrated into a fan-in package-on-package (Fi-PoP), as shown in FIG. 11. Semiconductor device 140 has contact pads 142. Contact pads 142 connect to conductive vias 144 by way of conductive layer 143. Conductive vias 144 are surrounded by insulating material 145 in the gap of semiconductor die 140 and electrically connect to contact pads 142. Conductive vias 144 further connect to interconnect structure 150 on substrate 148 by way of solder bumps 146. Semiconductor device 152 is mounted to a backside of substrate 148 using adhesive layer 154. Semiconductor device 152 electrically connects to interconnect structure 150 with bond wires 156. An encapsulant 158 is formed over semiconductor device 152 and bond wires 156. In one embodiment, semiconductor devices 140 and 152 are stacked memory devices.

The entire assembly 140-158 is mounted to substrate 160 with adhesive layer 162. Solder bumps 166 are formed on interconnect structure 164 as described in FIG. 10. Bond wires 168 electrically connect interconnect structure 150 on substrate 148 with interconnect structure 164 on substrate 160. Bond wires 170 electrically connect conductive vias 144 to interconnect structure 164 on substrate 160. A molding compound or encapsulant 172 is deposited over semiconductor device 140, substrate 148, and bond wires 168 and 170. Molding compound 172 can be made with epoxy acrylate or other polymer material and applied by transfer molding, liquid encapsulant molding, or other molding process. Molding compound 172 is non-conductive and environmentally protects the semiconductor device from external elements and contaminants.

A portion of molding compound 172 is removed to expose semiconductor die 140 and contact pads 142. Semiconductor device 174 is mounted to semiconductor device 176 using adhesive layer 178. Semiconductor device 178 is mounted to substrate 182 using adhesive layer 180. Solder bumps 186 are formed on interconnect structure 184 of substrate 182. Bond wires 188 electrically connect semiconductor device 174 to interconnect structure 184 on substrate 182. Bond wires 190 electrically connect semiconductor device 176 to interconnect structure 184 on substrate 182. An encapsulant or molding compound 192 covers semiconductor devices 174 and 176 and bond wires 188 and 190. The entire assembly 174-192 is mounted semiconductor die 140 by reflowing solder bumps 186 to contact pads 194. Contact pads 194 electrically connect to contact pads 142. Conductive vias 144 performs an integrated part of the electrical interconnection between stacked semiconductor devices 140, 152, 174, and 176 in the Fi-PoP.

Figure 12:
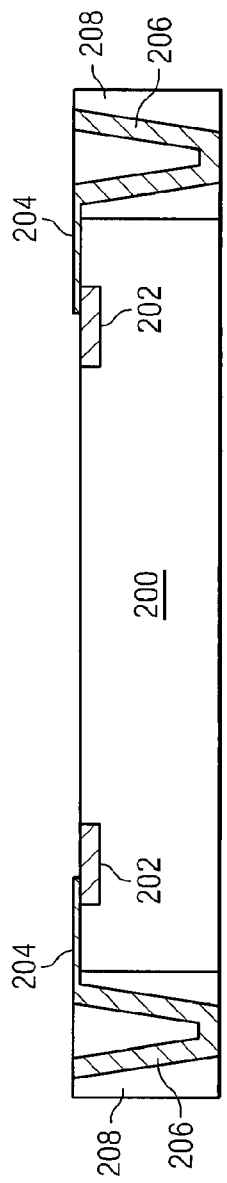
FIG. 12 illustrates conformal conductive full vias formed in the saw street around a periphery of the die.

In FIG. 12, semiconductor die 200 has contact pads 202 connected to conductive layer 204. Conductive vias 206 are patterned and deposited in the gap using a conformal electrolytic plating, electroless plating, or other suitable metal deposition process, similar to the process described in FIGS. 2a-2e. However, the gap are singulated outside conductive vias 206, i.e., the vias are not cut in half as per FIG. 2f. Accordingly, conductive vias 206 have a full "U" or truncated "V" shape. Conductive vias 206 are surrounded by organic material 208.

Figure 13:
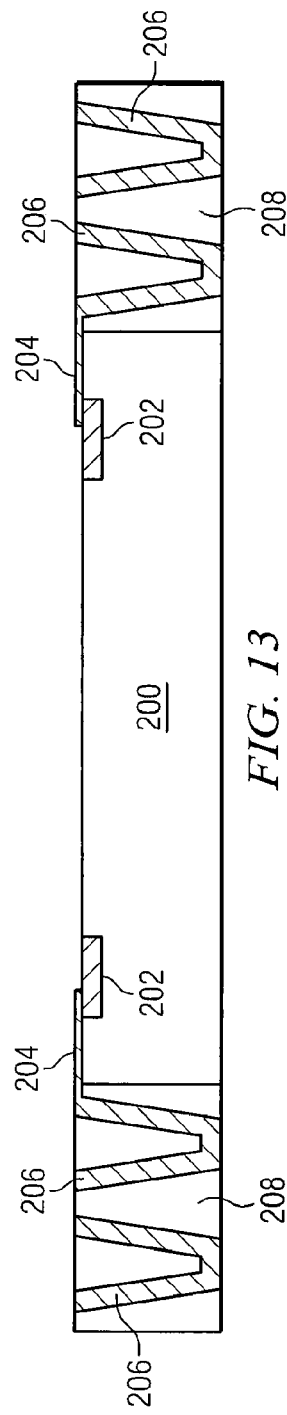
FIG. 13 illustrates inner and outer rows of conformal conductive full vias formed in the saw street around a periphery of the die.

FIG. 13 shows inner and outer rows of conductive full vias 206 formed in the gap on each side of semiconductor die 200. Again, each conductive via 206 is formed similar to FIGS. 2a-2e. Conductive vias 206 are surrounded by organic material 208.

Figure 14:
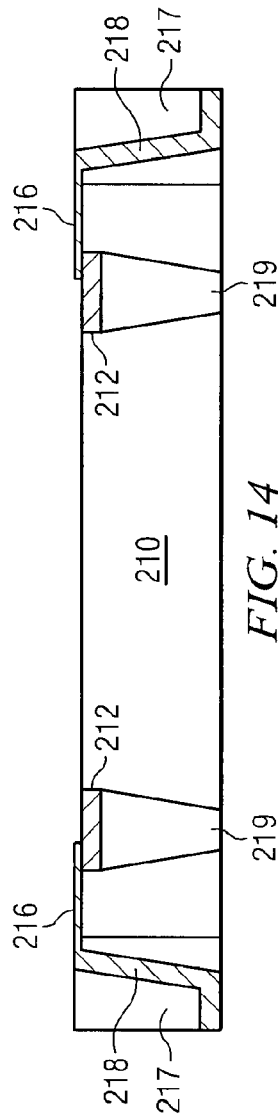
FIG. 14 illustrates conformal conductive half vias formed in the saw street with through silicon vias formed under the contact pads.

In FIG. 14, semiconductor die 210 has contact pads 212 connected to conductive layer 216. Conductive vias 218 are patterned and deposited in the gap using a conformal electrolytic plating, electroless plating, or other suitable metal deposition process, similar to the process described in FIGS. 2a-2g. Conductive vias 218 are surrounded by organic material 217. Through silicon vias 219 are formed under contact pads 212.

Figure 15:
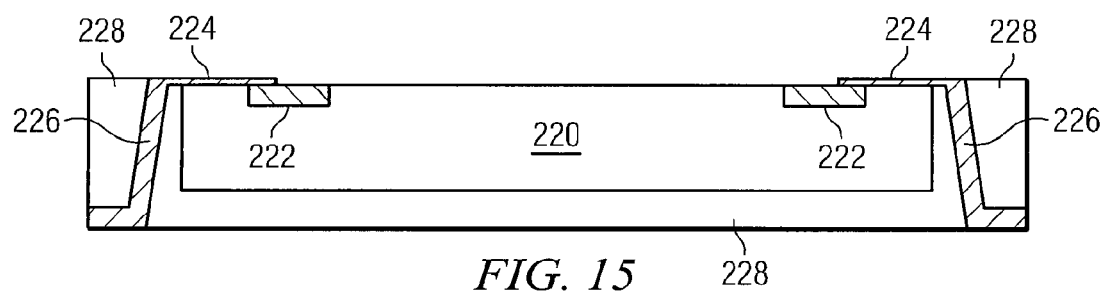
FIG. 15 illustrates conformal conductive half vias formed in the saw street with insulating material deposited under the die.

In FIG. 15, semiconductor die 220 has contact pads 222 connected to conductive layer 224. Conductive vias 226 are patterned and deposited in the gap using a conformal electrolytic plating, electroless plating, or other suitable metal deposition process, similar to the process described in FIGS. 2a-2g. Conductive vias 226 are surrounded by organic material 228. In this embodiment, the backside of semiconductor die 220 is vertically offset from the bottom of conductive vias 226 so that organic material 228 can be deposited on the backside of semiconductor die 220.

Figure 16:
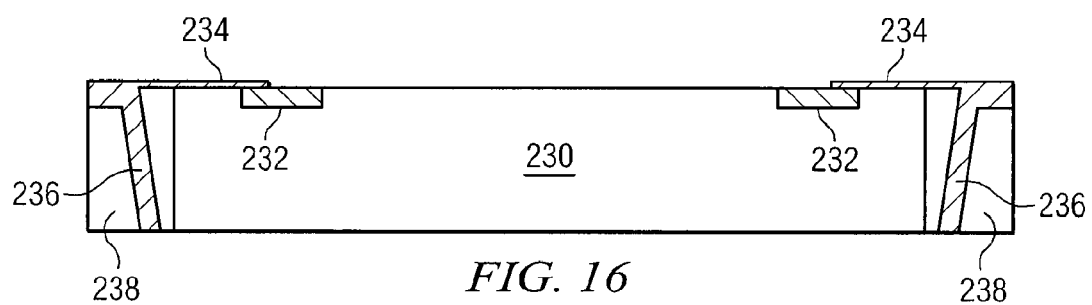
FIG. 16 illustrates conformal conductive inverted half vias formed in the saw street around a periphery of the die.

In FIG. 16, semiconductor die 230 has contact pads 232 connected to conductive layer 234. Conductive vias 236 are patterned and deposited in the gap using a conformal electrolytic plating, electroless plating, or other suitable metal deposition process. However, conductive vias 236 are inverted with respect to FIG. 2g. The taper of conductive vias 236 widens to the top of semiconductor die 230. Conductive vias 236 are surrounded by organic material 238.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a plurality of semiconductor die separated by a peripheral region that extends between the semiconductor die;
   a first insulating material deposited around the peripheral region of the semiconductor die to extend from a first surface of the semiconductor die to a second surface of the semiconductor die opposite the first surface;
   a first conductive layer formed over the first insulating material;
   a second insulating material deposited in the peripheral region over the first conductive layer to form a conductive via disposed between the first and second insulating materials; and
   a second conductive layer formed over the semiconductor die and electrically connected between a contact pad on the semiconductor die and the first conductive layer.

2. The semiconductor device of claim 1, wherein the conductive via is tapered or vertical.

3. The semiconductor device of claim 1, wherein a portion of the conductive via extends outside the first and second insulating materials.

4. The semiconductor device of claim 1, further including a recess formed in the second insulating material.

5. The semiconductor device of claim 1, further including a plurality of rows of the conductive vias formed in the peripheral region between the first and second insulating materials.

6. The semiconductor device of claim 1, further including a plurality of stacked semiconductor die electrically connected through the conductive via.

7. A semiconductor device, comprising:
   a semiconductor die;
   a first insulating material deposited around the semiconductor die;
   a via formed through the first insulating material;
   a first conductive layer formed over the first insulating material;
   a second insulating material deposited over the first conductive layer and within the via including a first portion of the first conductive layer coplanar with the second insulating material; and
   a second conductive layer formed over the semiconductor die and electrically connected between a contact pad on the semiconductor die and the first conductive layer.

8. The semiconductor device of claim 7, wherein the first conductive layer includes vertical and lateral components with the vertical component disposed over the first insulating material.

9. The semiconductor device of claim 7, wherein the first conductive layer is tapered or vertical.

10. The semiconductor device of claim 7, wherein a second portion of the first conductive layer extends outside the first and second insulating materials.

11. The semiconductor device of claim 7, further including a recess formed in the second insulating material.

12. The semiconductor device of claim 7, further including a plurality of rows of the first conductive layer formed between the first and second insulating materials.

13. The semiconductor device of claim 7, further including a plurality of stacked semiconductor die electrically connecting through the first conductive layer.

14. A semiconductor device, comprising:
   a semiconductor die;
   a first insulating material deposited around the semiconductor die;
   a via formed through the first insulating material;
   a first conductive layer formed over the first insulating material; and
   a second insulating material deposited over the first conductive layer and in the via.

15. The semiconductor device of claim 14, further including a second conductive layer formed over the semiconductor die and electrically connected between a contact pad on the semiconductor die and the first conductive layer.

16. The semiconductor device of claim 14, wherein a portion of the first conductive layer extends outside the first and second insulating materials.

17. The semiconductor device of claim 14, further including a recess formed in the second insulating material.

18. The semiconductor device of claim 14, further including a plurality of rows of the first conductive layer formed between the first and second insulating materials.

19. The semiconductor device of claim 14, further including a plurality of stacked semiconductor die electrically connected through the first conductive layer.

* * * * *